United States Patent
Faig et al.

(10) Patent No.: US 11,070,224 B1
(45) Date of Patent: Jul. 20, 2021

(54) METHOD AND APPARATUS FOR IMPLEMENTING MULTIRATE SERDES SYSTEMS

(71) Applicant: Mellanox Technologies, Ltd., Yokneam (IL)

(72) Inventors: Hananel Faig, Jerusalem (IL); Adam Kaminer, Tel Aviv (IL); David (Dima) Rochlin, Haifa (IL); Raanan Ivry, Kesaria (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/868,894

(22) Filed: May 7, 2020

(51) Int. Cl.
  *H03M 1/00* (2006.01)
  *H03M 1/12* (2006.01)
  *H03M 1/20* (2006.01)
  *H03M 1/06* (2006.01)

(52) U.S. Cl.
  CPC ......... *H03M 1/126* (2013.01); *H03M 1/0626* (2013.01); *H03M 1/207* (2013.01)

(58) Field of Classification Search
  CPC .......................... H03M 1/126; H03M 1/0626
  USPC .................. 341/114, 143, 142, 122, 123
  See application file for complete search history.

(56) References Cited

U.S. PATENT DOCUMENTS

2014/0192850 A1* 7/2014 Meng ............... H04B 1/38
                                                         375/219

\* cited by examiner

*Primary Examiner* — Peguy Jean Pierre
(74) *Attorney, Agent, or Firm* — Alston & Bird LLP

(57) ABSTRACT

A method for providing back-compatibility for rational sampling rate disparities between two circuitries, comprises: a) providing a Phase Locked Loop (PLL) operating at a rate different than that of the Symbols generator, which is coupled to a Digital to Analog Converter (DAC) or an Analog to Digital Converter (ADC); b) providing an interpolation filter coupled to said converter, which filter is adapted to perform sampling rate conversion operations on the samples using zero-stuffing, filtering, and decimation, or the like computation-saving algorithm; and c) obtaining the sampling of the symbols at the required and compatible rate.

17 Claims, 5 Drawing Sheets

US 11,070,224 B1

METHOD AND APPARATUS FOR IMPLEMENTING MULTIRATE SERDES SYSTEMS

FIELD OF THE INVENTION

The present invention relates to Serializer/Deserializer (SerDes) systems. More particularly, the invention relates to a method and apparatus for interfacing a SerDes transmitting or receiving front end operating at given sampling rate, with an associated backend operating at any lower rational sampling rate.

BACKGROUND OF THE INVENTION

One of the critical tasks of a SerDes is to connect two System on Chip (SoC) devices by transmitting a high-speed digital data stream over a single differential-pair analog line. Among the others, the SerDes comprises two main functional blocks: a transmitting block, and a receiving block.

A prior art transmitting block diagram is shown in FIG. 1. The "digital backend" 10 consists of a generator of a sequential stream of symbols (digital values) 11, and of one or more associated digital filters 12. The output of the digital filters 12 consists of a serial stream of digital samples, that enters the "front end" 13 at a rate equal to the symbol rate. The front end consists of a Phase Locked Loop (PLL) 14, and a Digital to Analog Converter (DAC) 15. PLL 14 generates a DAC sampling clock of frequency identical to the data rate of the serial stream of digital samples fed by the digital backend 10. Thus, since the front end 13 and the backend 10 are exactly synchronized, the DAC 15 accepts the digital serial stream of samples from the backend 10, sample by sample, converts it to analog form, and transmits it over the differential pair analog line.

A prior art receiving block diagram is shown in FIG. 2. The front end 20 consists of an Analog to Digital Converter (ADC) 21, a Clock and Data Recovery (CDR) circuit 22, a PLL 23, and a Phase Interpolator (PI) 24. The analog data from the differential-pair analog line enters the ADC 21. The CDR/PLL/PI combination generates an adaptive clock such that the ADC 21 samples the analog data at the appropriate instants, at the symbol rate, so to reconstruct the stream of digital samples originally fed by the transmitter backend. The digital backend consists of a Digital Signal Processor (DSP) 25 that accepts the digital samples, and performs decoding actions so to appropriately recover the sequence of symbols originally generated by the transmitter backend.

The communications standards continuously evolve demanding more and more increasing data transmission rates. The immediate outcome is that both transmitter and receiver must be capable to operate at higher sampling rates than before. In particular, this implies designing the hardware of new-generation products to have faster front end circuits. However, new-generation products must be back-compatible with older standards, namely, both transmitter and receiver must be capable to process also symbol rates that are lower than their maximal sampling rate capability, while still providing a uniform number of samples per symbol. To clarify this point, assume that the sampling rate of a new-generation product is Fnew and the sampling rate of an older-generation product is Fold, where Fold<Fnew, and the new-generation product must adapt to process the old-generation symbols. If Fnew is an integer multiple of Fold, the adaptation is a simple process, namely, sampling at rate Fnew, and dropping the redundant samples. This samples-dropping is a well-known technique denoted as "decimation". However, if Fnew/Fold is not an integer number, decimation cannot be applied as it would yield a non-uniform number of samples per symbol. For instance, if Fnew=53.125 GHz according to the newer NDR standard and Fold=25.78125 GHz according to the older EDR standard, then Fnew/Fold=68/33 so that some symbols yield 2 samples while others yield 3 samples.

As long as Fnew/Fold is a rational number, several possible solutions for both transmitter and receiver exist. However, as explained hereinbelow, all the current-art solutions suffer from serious drawbacks, both in cost and in hardware complexity. It is therefore an object of the invention to provide a novel method that allows back-compatibility for rational sampling rate disparities, which is free from the disadvantages of the prior art.

It is another object of the invention to provide such a method, which is applicable to both transmitter and receiver.

It is yet another object of the invention to provide hardware, which is adapted to operate the method of the invention, and which is simpler and less expensive than prior art solutions.

Other objects and advantages of the invention will become apparent as the description proceeds.

SUMMARY OF THE INVENTION

The invention is directed to a method for providing back-compatibility for rational sampling rate disparities between two circuitries, comprising:

a) providing a Phase Locked Loop (PLL) operating at a rate different than that of the Symbols generator, which is coupled to a Digital to Analog Converter (DAC) or an Analog to Digital Converter (ADC);

b) providing an interpolation filter coupled to said converter, which filter is adapted to perform sampling rate conversion operations on the samples using zero-stuffing, filtering, and decimation, or the like computation-saving algorithm; and c) obtaining the sampling of the symbols at the required and compatible rate.

In one embodiment of the invention the circuitry is a transmitter, the converter is a DAC, and the interpolation filter is provided before the DAC. In another embodiment of the invention the converter is an ADC, and the interpolation filter is provided after the ADC.

Further provided by the invention is a system for providing back-compatibility for rational sampling rate disparities between two circuitries, comprising:

a) a Phase Locked Loop (PLL) operating at a rate different than that of the Symbols generator, which is coupled to a Digital to Analog Converter (DAC) or an Analog to Digital Converter (ADC); and b) an interpolation filter coupled to said converter, which filter is adapted to perform zero-stuffing, filtering, and decimation, or the like computation-saving algorithm, and sampling rate conversion operations on the symbols.

In one embodiment of the invention the circuitry is a transmitter, the converter is a DAC, and the interpolation filter is provided before the DAC, and in another embodiment of the invention the converter is an ADC, and the interpolation filter is provided after the ADC.

In yet another embodiment, the system of the invention further comprises a Clock and Data Recovery (CDR). In one embodiment the CDR is located between the interpolation filter and a DSP, and in another embodiment the CDR is located between the ADC and the interpolation filter.

DETAILED DESCRIPTION OF THE INVENTION

The invention will now be described also by referring to prior art solutions, for ease of understanding. As stated, the invention is applicable to both transmitters and receivers and, accordingly, those will be discussed in detail below.

Transmitter

Figure 1:
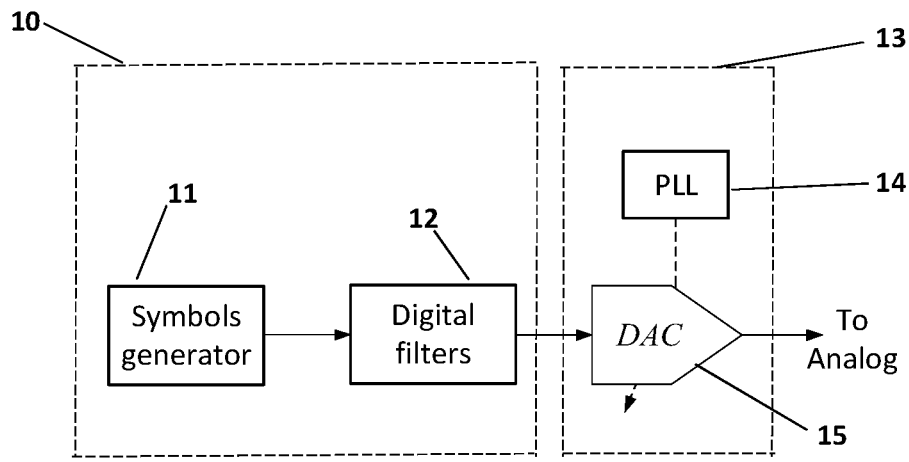
FIG. 1 is a block diagram of a prior art DSP-based transmitter.
Figure 3:
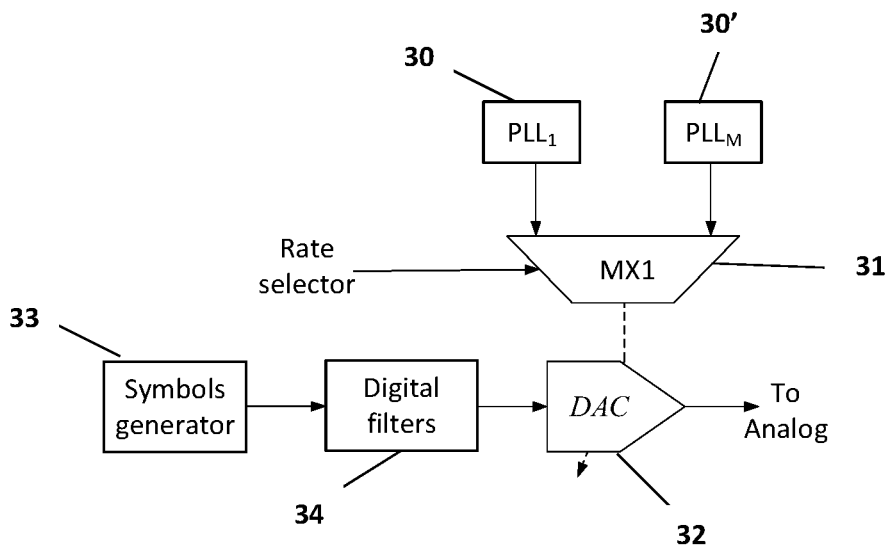
FIG. 3 is a block diagram of a prior art multirate transmitter solution.
Figure 4:
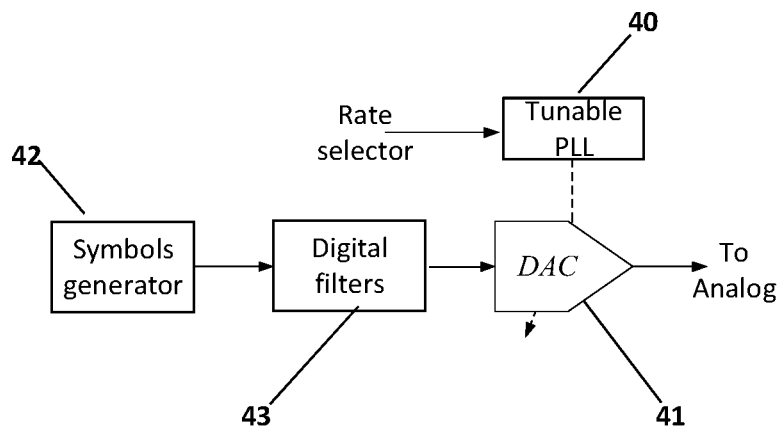
FIG. 4 is a block diagram of another prior art multirate transmitter solution.

FIG. 3 is a block diagram of one prior art solution, and FIG. 4 is a block diagram of an alternative prior art solution, both which are adapted to modify the prior art transmitter of FIG. 1, to adapt it to handle multiple symbol rates. In both cases the PLL-generated clock is synchronized with the digital backend clock.

a) FIG. 3 shows a multi-PLL solution. The solution includes a fixed PLL (30-3') for each symbol rate to be processed. A multiplexer 31 selects which PLL to connect to the DAC 32, according to the symbol rate in the backend (generated by symbol generator 33 and filtered by digital filters 34). This solution exhibits two major drawbacks:

1. The use of multiple PLLs and associated multiplexer results in hardware proliferation, with associated cost and on-chip real-estate usage.

2. Multiple PLLs suffer from mutual coupling due to electromagnetic leakage. The mutual coupling triggers a crosstalk phenomenon known as "injection locking," which causes the PLLs to influence each other, resulting in parasitic jitter and frequency drift.

b) FIG. 4 shows a tunable-PLL solution. The solution includes a PLL 40, which connects to DAC 41, that may be tuned to match the sampling rate of the backend (generated by symbol generator 42 and filtered by digital filters 43). This solution too presents two major drawbacks:

1. The hardware implementation of a tunable PLL at high-frequency bands is very expensive.

2. Due to the tuning arrangements, a tunable PLL exhibits higher phase noise as compared to a fixed PLL. In turn, the phase noise produces jitter that degrades the sampling accuracy.

Figure 5:
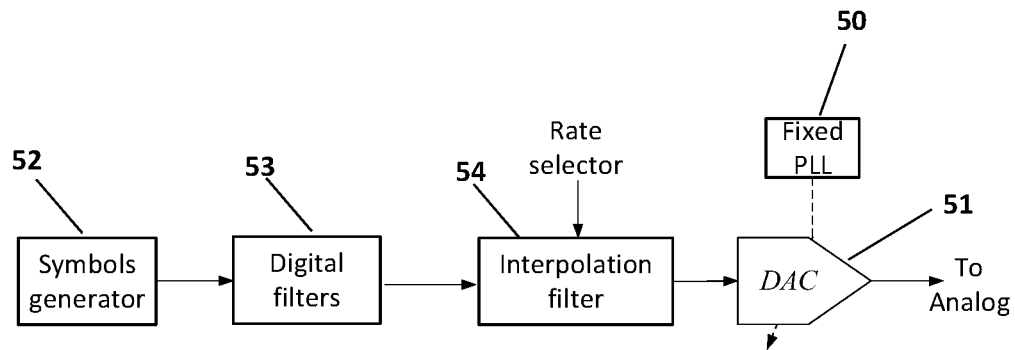
FIG. 5 is a block diagram of a multirate transmitter solution according to one embodiment of the invention.

The invention obviates the abovementioned disadvantages of the prior art, as illustrated in FIG. 5, which shows a block diagram according to one embodiment of the invention, in which:

1. The PLL 50 that generates the DAC sampling clock works at fixed frequency equal to the highest new-generation frequency Fnew. Thus the front end DAC 51 always operates at the maximal sampling rate.

2. The symbols generator 52 and the digital filters 53 operate at some old-generation frequency Fold. Thus the backend operates at a frequency lower than the front end, while Fnew/Fold is a rational number.

3. A digital operator known as an "interpolation filter" 54 is inserted between the backend filters 53 and the front end DAC 51. In order for the interpolation filter 54 to correctly process the samples from the backend, it performs three subsequent operations, which are shortly mentioned here for exemplification. The interpolation process for performing rational sampling rate conversion, which is utilized when operating according to the invention, is a standard operation well-known to anyone skilled in the art and therefore it does not need to be discussed in detail. Nevertheless, to facilitate the understanding of the reader, the in-principle steps are briefly explained:

a) Zero-stuffing. This operation, also known as "upsampling" rises the backend sampling rate by inserting zero-valued samples between existing samples.

b) Lowpass filtering. This operation eliminates undesired aliased spectra.

c) Decimation. This operation, also known as "downsampling" discards redundant samples until the sampling rate reduces to the desired value.

The sampling rate conversion is selected by the rate selector control.

Since in the rate conversion process many samples have zero value, and some samples will be dropped by the decimation process, the operations described above may be carried out in several computational-saving ways such as using "filter banks", "Look-up Tables," etc.

In summary, according to the invention, the multirate transmitter of FIG. 5 is capable to handle multiple symbol rates while using a fixed PLL at the highest possible symbol rate, thus improving both cost and performance with respect to the current art.

Example

Figure 6:
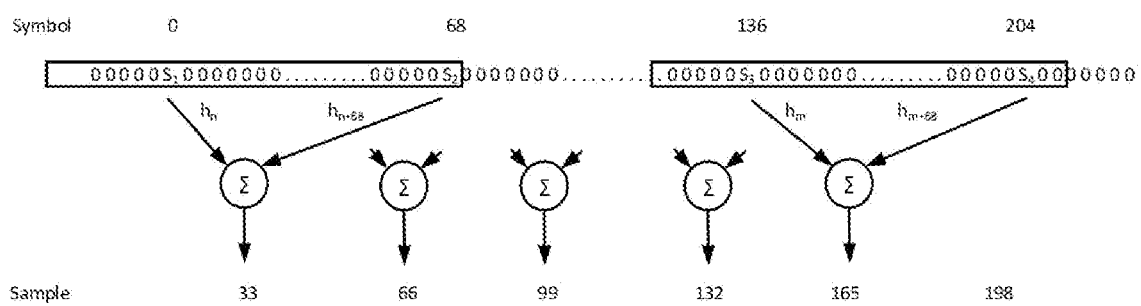
FIG. 6 is an illustrative example of a rational sampling rate conversion including Zero-Stuffing and Decimation processes.

An illustrative example of the zero-stuffing process is shown in FIG. 6. In this example, the Sampling Rate is 53.125 GHz and the Symbol Rate is 25.78125 GHz, resulting in a Symbol Rate/Sampling Rate of 33/68. As shown the figure, 67 zeros are "stuffed" after each sample, thus yielding 68 samples, and then the stream is filtered, and the filter output is sampled at each 33 positions. Therefore, the correct symbols are sampled although the Symbol Rate/Sampling Rate is not an integer.

Receiver

Figure 2:
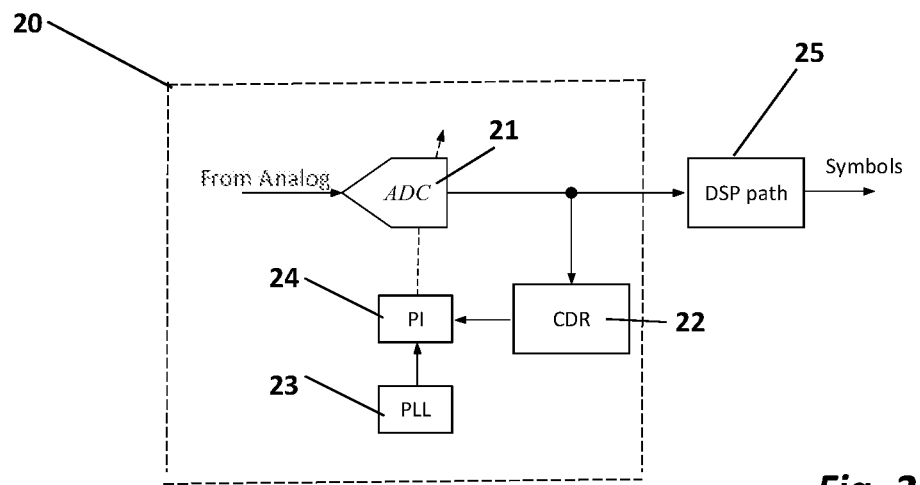
FIG. 2 is a block diagram of a prior art receiver.

FIG. 2 described above shows the block diagram of a prior art receiver. If the receiver has to be capable to operate at multiple symbol rates, the ADC 21 must be capable to sample the analog data at multiple rates. This in turn implies that given a symbol rate (which for the purposes of this description and without loss of generality we assume known) the PLL 23 must operate at that rate, which may be done by applying the same prior art solutions as hereinbefore described with reference to the transmitter, namely either using multiple PLLs, or a tunable PLL, with the same drawbacks discussed before.

Figure 7:
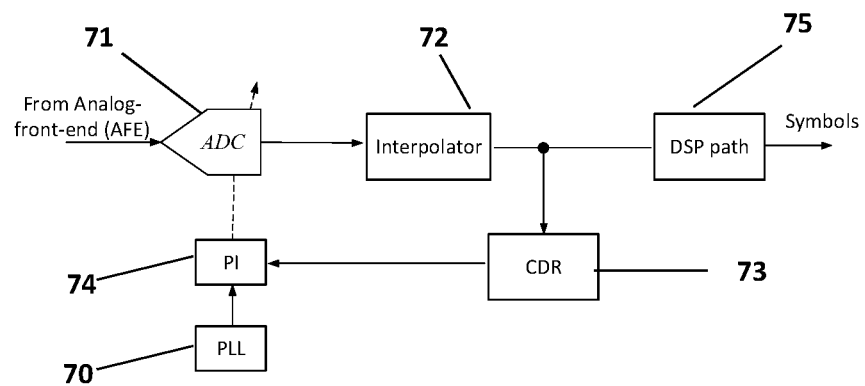
FIG. 7 is a block diagram of a multirate receiver solution according to an embodiment of the invention.

FIG. 7 shows a block diagram of a receiver according to one embodiment of the invention, in which:

1. The PLL 70 that generates the ADC source sampling clock works at fixed frequency equal to the highest new-generation frequency Fnew. Thus, the ADC 71 in the front end always operates at the maximal sampling rate.

2. The interpolation filter 72 accepts the samples at highest rate Fnew, and performs a sampling rate conversion down to Fold.

3. The CDR 73 utilizes the down-rated samples to control the PI 74, so that the PLL-generated clock, which operates at the highest rate Fnew, is adaptively delayed so to sample the analog data at the optimal sampling instants.

4. The down-rated samples at rate Fold are accepted by the DSP 75 that performs decoding actions so to appropriately recover the sequence of symbols at symbol rate Fold.

It should be noted that while FIG. 7 shows CDR 73 as taking data at the lower sampling rate after interpolator 72, in another embodiment of the invention (not shown for the sake of brevity) CDR 73 can be positioned before interpolator 72 to take data at the higher sampling rate, and the skilled person will easily make the engineering choice of where to position it.

According to the invention, the multirate receiver of FIG. 7 is capable of handling multiple symbol rates while using a fixed PLL at the highest possible symbol rate, thus improving both cost and performance as compared to the prior art.

Figure 8:
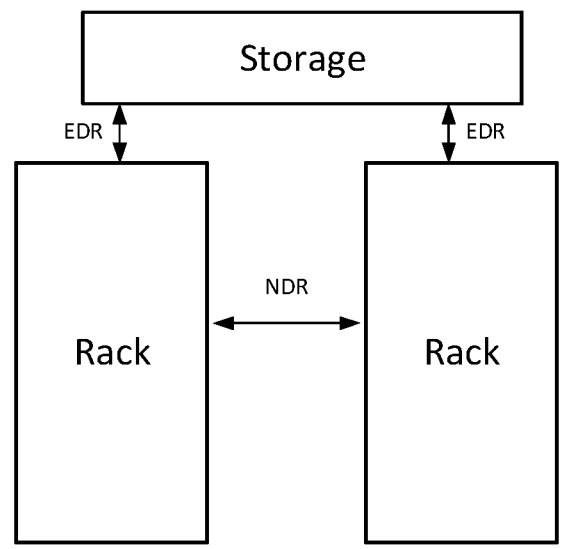
FIG. 8 is a high-level block diagram showing how two EDR systems communicating over transmit and receive multirate products capable to handle NDR systems according to the invention.
Figure 9:
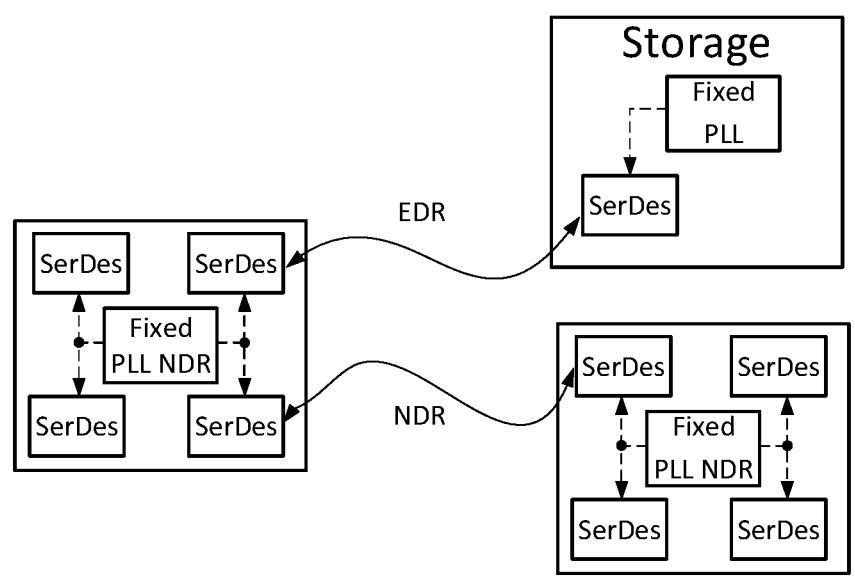
FIG. 9 is a high-level block diagram showing a multirate NDR-capable system simultaneously communicating with a similar multirate system and an old-generation EDR system according to the invention.

To further illustrate the advantages of the invention, FIG. 8 shows a high-level block diagram illustrating how two EDR systems communicating over transmit and receive multirate products capable to handle NDR systems according to the invention. Similarly, FIG. 9 is a high-level block diagram showing a multirate NDR-capable system simultaneously communicating with a similar multirate system and an old-generation EDR system according to the invention.

All the above description of embodiments of the invention has been provided for the purpose of illustration and is not intended to limit the invention in any way, except as defined by the appended claims.

The invention claimed is:

1. A method for providing back-compatibility for rational sampling rate disparities between circuitries, the method comprising:
generating, by a symbols generator, a stream of symbols at a symbol rate;
generating, by a digital filter connected with the symbols generator, a stream of digital samples having the symbol rate;
converting, by an interpolation filter coupled with the digital filter, the stream of digital samples from the symbol rate to a sampling rate, wherein the sampling rate is greater than the symbol rate; and
sampling, by
a Digital to Analog Converter (DAC), the stream of digital samples at the sampling rate, wherein a Phase Locked Loop (PLL) coupled with the DAC is configured to cause sampling by the DAC at a fixed frequency as defined by the sampling rate.

2. The method according to claim 1, wherein the interpolation filter is configured to employ a zero-stuffing operation in converting the stream of digital samples from the symbol rate to the sampling rate.

3. The method according to claim 1, wherein the interpolation filter is configured to employ a lowpass filtering operation in converting the stream of digital samples from the symbol rate to the sampling rate.

4. The method according to claim 1, wherein the interpolation filter is configured to employ a decimation operation.

5. The method according to claim 1, wherein the interpolation filter further comprises a rate selector control configured to control performance of the rate conversion.

6. A system for providing back-compatibility for rational sampling rate disparities between circuitries, the system comprising:
a symbols generator configured to generate a stream of symbols at a symbol rate;
a digital filter configured to receive the stream of symbols at the symbol rate and generate a stream of digital samples having the symbol rate;
an interpolation filter coupled with the digital filter;
a Digital to Analog Converter (DAC) coupled with the interpolation filter; and
a Phase Locked Loop (PLL) coupled with the DAC and operating at a sampling rate that is greater than the symbol rate, wherein the PLL is configured to cause sampling by the DAC at a fixed frequency as defined by the sampling rate,
wherein the interpolation filter is configured to convert the stream of digital samples from the symbol rate to the sampling rate for use by the DAC.

7. The system according to claim 6, wherein the interpolation filter is configured to employ a zero-stuffing operation in converting the stream of digital samples from the symbol rate to the sampling rate.

8. The system according to claim 6, wherein the interpolation filter is configured to employ a lowpass filtering operation in converting the stream of digital samples from the symbol rate to the sampling rate.

9. The system according to claim 6, wherein the interpolation filter is configured to employ a decimation operation.

10. The system according to claim 6, wherein the interpolation filter further comprises rate selector control configured to control performance of the rate conversion.

11. A system for providing back-compatibility for rational sampling rate disparities between circuitries, the system comprising:
an Analog to Digital Converter (ADC) configured to receive a stream of samples;
a Phase Locked Loop (PLL) coupled with the ADC and configured to cause sampling of the stream of samples by the ADC at a fixed frequency as defined by a sampling rate;
an interpolation filter coupled with the ADC, wherein the interpolation filter is configured to convert the stream of samples from the sampling rate to a symbol rate, wherein the symbol rate is less than the sampling rate; and
a digital signal processor (DSP) configured to receive the stream of samples at the symbol rate and recover a sequence of signals associated with the stream of samples.

12. The system according to claim 11, wherein the interpolation filter is configured to employ a zero-stuffing operation in converting the stream of samples from the sampling rate to the symbol rate.

13. The system according to claim 11, wherein the interpolation filter is configured to employ a lowpass filtering operation in converting the stream of samples from the sampling rate to the symbol rate.

14. The system according to claim 11, wherein the interpolation filter is configured to employ a decimation operation in converting the stream of samples from the sampling rate to the symbol rate.

15. The system according to claim 11, further comprising:
   a phase interpolator coupled with the ADC and the PLL; and
   a Clock and Data Recovery (CDR) coupled with the phase interpolator and configured to control the phase interpolator so as to adaptively delay the PLL.

16. The system according to claim 15, wherein the CDR is located between the interpolation filter and the DSP.

17. The system according to claim 15, wherein the CDR is located between the ADC and the interpolation filter.

\* \* \* \* \*